United States Patent
Lee et al.

(10) Patent No.: US 6,890,595 B2
(45) Date of Patent: May 10, 2005

(54) METHOD FOR COATING LOW VISCOSITY MATERIALS

(75) Inventors: Ai-Yi Lee, Taipei (TW); Wen-Chi Chang, Bade (TW)

(73) Assignee: Nanya Technology Corporation, Taoyuan (TW)

( * ) Notice: Subject to any disclaimer, the term of this patent is extended or adjusted under 35 U.S.C. 154(b) by 52 days.

(21) Appl. No.: 10/313,099

(22) Filed: Dec. 5, 2002

(65) Prior Publication Data

US 2004/0076749 A1 Apr. 22, 2004

(30) Foreign Application Priority Data

Oct. 22, 2002 (TW) ........................................ 91124328 A

(51) Int. Cl.⁷ .............................................. B05D 3/12
(52) U.S. Cl. ...................... 427/240; 427/299; 427/352; 427/425; 118/52; 118/320; 438/780; 438/782
(58) Field of Search ................................ 427/240, 425, 427/299, 352; 118/52, 320; 438/780, 782

(56) References Cited

U.S. PATENT DOCUMENTS

| | | | | |
|---|---|---|---|---|
| 5,405,813 A | * | 4/1995 | Rodrigues | 438/782 |
| 5,773,082 A | * | 6/1998 | Ku et al. | 427/240 |
| 5,912,049 A | * | 6/1999 | Shirley | 427/240 |
| 5,985,363 A | * | 11/1999 | Shiau et al. | 427/240 |
| 5,989,632 A | * | 11/1999 | Sanada et al. | 427/240 |
| 6,117,486 A | * | 9/2000 | Yoshihara | 427/240 |
| 6,387,825 B2 | * | 5/2002 | You et al. | 438/782 |
| 2003/0087535 A1 | * | 5/2003 | Matsuura | 438/782 |

* cited by examiner

*Primary Examiner*—Kirsten Jolley
(74) *Attorney, Agent, or Firm*—Ladas & Parry LLP

(57) ABSTRACT

A method for coating low viscosity materials onto a wafer to form a uniform film. After a wafer is rotated at a first rotation speed, coating solution is dispensed onto the wafer. The wafer is decelerated to a second rotation speed at a first deceleration rate to spread the coating solution. Next, the wafer is slowly decelerated to a third rotation speed at a second deceleration rate considerably lower than the first deceleration rate, so the coating solution reflows to the center of the wafer. The wafer is then quickly accelerated to a fourth rotation speed at a third acceleration rate larger than the first deceleration rate to spread the coating solution again.

13 Claims, 4 Drawing Sheets

METHOD FOR COATING LOW VISCOSITY MATERIALS

BACKGROUND OF THE INVENTION

1. Field of the Invention

The present invention relates generally to manufacturing processes for semiconductor integrated circuit devices. More particularly, to an improved method of applying a lower viscosity coating liquid, such as a photoresist solution and an anti-reflection film coating (ARC) solution, onto a semiconductor wafer to form film with uniform surface.

2. Description of the Related Art

Recently, wafer size tends to increase as device circuits are miniaturized. With this tendency, a low-viscosity photoresist solution and low-viscosity anti-reflection coating film solution (hereinafter referred to as "ARC solution") have been increasingly used. For forming a thicker film coating the low-viscosity solution onto the wafer, the common method reduces the rotation speed of the wafer to increase coating thickness. However, the thickness of the coating film is thicker than the predetermined thickness and the uniformity is worse.

In general, the traditional coating process substantially comprises five steps.

Step I: spraying a solvent (also called prewetting)
Step II: drying the solvent
Step III: dispensing a coating solution
Step IV: spreading the coating solution
Step V: cleaning the wafer An example using the traditional coating method to form a photoresist film with predetermined thickness of 1350 Å is given in Table 1 and FIG. 1 which shows the wafer rotation speeds in each step.

TABLE 1

| step | Time (sec) | Rotation speed (rpm) | Acceleration/ deceleration rate (rpm/sec) | |
|------|------|------|-------|------|
|      | 1.0  | 0    |       |      |
| I    | 1.5  | 0    |       | Spraying a solvent |
| II   | 3.0  | 2000 | 10000 |      |
| III  | 2.6  | 1000 | 10000 | Dispensing a photoresist solution (2.5 cc/2.2 sec) |
| IV   | 95.0 | 525  | 10000 | Spreading the photoresist solution |
| V    | 1.0  | 2000 | 10000 | Cleaning edge of the wafer |
|      | 5.0  | 2000 |       | Cleaning edge/backside of the wafer |
|      | 1.0  | 2500 | 10000 | Cleaning edge of the wafer |
|      | 5.0  | 3000 | 10000 | Cleaning edge of the wafer |
|      | 1.0  | 0    | 10000 |      |

Referring to Table 1 and FIG. 1, after the wafer is positioned in a spin coater and the rotation speed is kept at 0 rpm/sec, solvent is sprayed on the surface of the wafer for 1.5 seconds to prewet the surface of the wafer.

The solvent is dried while the wafer is accelerated from 0 rpm to 2,000 rpm and kept at 2,000 rpm at a rate of 10,000 rpm/sec for 3 seconds.

The photoresist solution is dispensed on the surface of the wafer at a rate of 2.5 cc/2.2 sec for 2.6 seconds while the wafer is decelerated from 2,000 rpm to 1,000 rpm at a rate of 10,000 rpm/Sec.

The coating solution dispensed on the wafer is spread for 95 seconds while the wafer is decelerated from 1,000 rpm to 525 rpm at a rate of 10,000 rpm/sec to form the photoresist film with predetermined thickness.

The wafer is accelerated from 1,000 rpm to 2,000 rpm at a rate of 10,000 rpm/sec and kept at 2,000 rpm total for 1 second while the edge of the wafer is cleaned. The wafer is kept at 2,000 rpm for 5 seconds and the edge and backside of the wafer are cleaned. The wafer is accelerated from 2,000 rpm to 2,500 rpm at a rate of 10,000 rpm/sec while the edge of the wafer is cleaned for 1 second. The wafer is accelerated from 2,500 rpm to 3,000 rpm at a rate of 10,000 rpm/sec while the edge of the wafer is cleaned for 5 seconds.

However, while the traditional coating method is used to form the photoresist film in 8 inch wafers, the obtained photoresist film has poor uniformity. As shown in FIG. 2, the average thickness of the photoresist layer is 1331.19 Å, and the thickness variation is as high as 31.07 Å. In this manner, some problems may occur in subsequent processes such as photolithography and etching. For example, the width of the conducting line formed after etching is not uniform, and yield is decreased. These problems will become more serious with increases in the size of the wafer.

SUMMARY OF THE INVENTION

The object of the present invention is to provide a method for coating low viscosity materials to form a film with good uniformity.

To achieve the above mentioned object, the present invention provides a method for coating low viscosity materials. After a wafer is rotated at a first rotation speed, coating solution is dispensed onto the wafer. The wafer is decelerated to a second rotation speed at a first deceleration rate to spread the coating solution. Next, the wafer is slowly decelerated to a third rotation speed at a second deceleration rate which is considerably lower than the first deceleration rate so the coating solution reflows to the center of the wafer. The wafer is then quickly accelerated to a fourth rotation speed at a third acceleration rate which larger than the first deceleration rate to spread the coating solution again.

In the above-mentioned method, the coating solution can be a photoresist solution or an anti-reflection film coating (ARC) solution. The first deceleration rate, the second deceleration rate and the third acceleration rate are, for example, 10,000 rpm/sec, 100 rpm/sec and 50,000 rpm/sec, respectively.

The present invention also provides another method for coating low viscosity materials comprising:

(a) spraying a solvent on a surface of a wafer;
(b) drying the wafer;
(c) dispensing a coating solution with a dispensing rate on the surface of the wafer;
(d) first spreading the coating solution;
(e) reflowing the coating solution to the center of the wafer; and
(f) again spreading the coating solution.

In the above mentioned steps, the dispensing rate of the coating solution is between 2.5 cc/2.2 sec and 1.5 cc/1.7 sec.

In the above-mentioned steps, the coating solution is a photoresist solution or an ARC solution.

In the above-mentioned step (d), the method of first spreading the coating solution comprises decelerating the wafer from a first rotation speed to a second rotation speed at a first deceleration rate and maintaining the wafer at the second rotation speed for a period of time.

In the above-mentioned step (e), the method of reflowing the coating solution to the center of the wafer comprises slowly decelerating the wafer to a third rotation speed at a second deceleration rate, wherein the second deceleration rate is considerably lower than the first deceleration rate; and maintaining the wafer at the third rotation speed for a period of time.

In the above-mentioned step (f), the method of again spreading the coating solution comprises quickly accelerating the wafer to a fourth rotation speed at a third acceleration rate, wherein the third acceleration rate is higher than the first deceleration rate, and maintaining the wafer at the fourth rotation speed for a period of time.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

In the traditional coating process, after dispensing the coating solution onto the wafer, the rotation speed of the wafer is reduced to a determined speed and the coating solution is spread at the same time. Research has shown that poor coating film uniformity occurs when coating solution is spread only one time in the coating process.

In order to solve the above-mentioned problem, the present invention improves the step of spreading the coating solution.

The coating method provided in the present invention comprises:

Step I: spraying a solvent (also called prewetting)
Step II: drying the solvent
Step III: dispensing a coating solution
Step IV: spreading the coating solution, reflowing the coating solution to the center of the wafer, and respreading the coating solution
Step V: cleaning the wafer After dispensing the coating solution on the surface of the wafer, the coating solution is spread twice, thereby providing more uniform coating film. The coating solution can spread more than twice, and the present invention accordingly does not limit the process to two spreadings.

The coating method of the present invention will be explained in detail in the following embodiments.

First Embodiment

Figure 1:
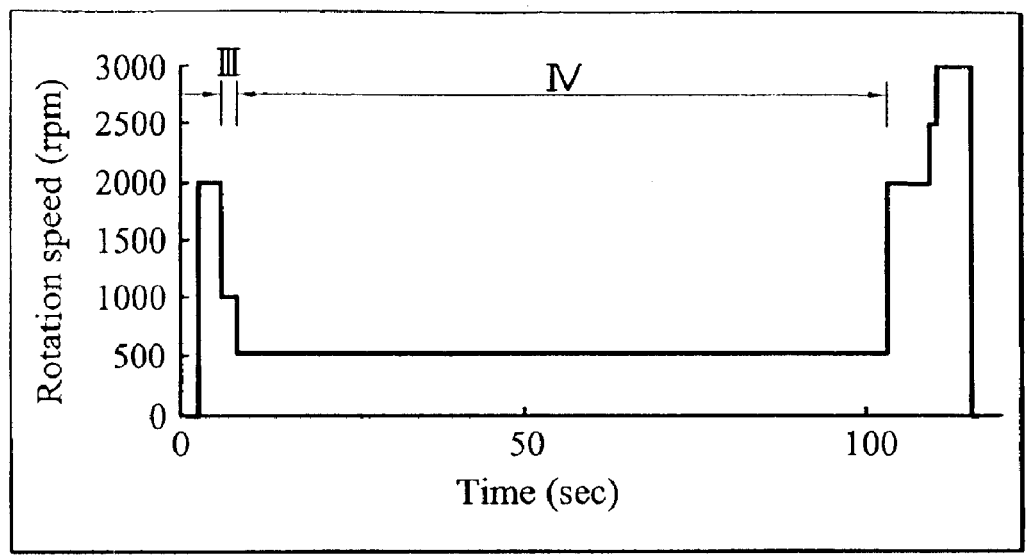
FIG. 1 shows the wafer rotation speeds in each step for the traditional coating method.
Figure 2:
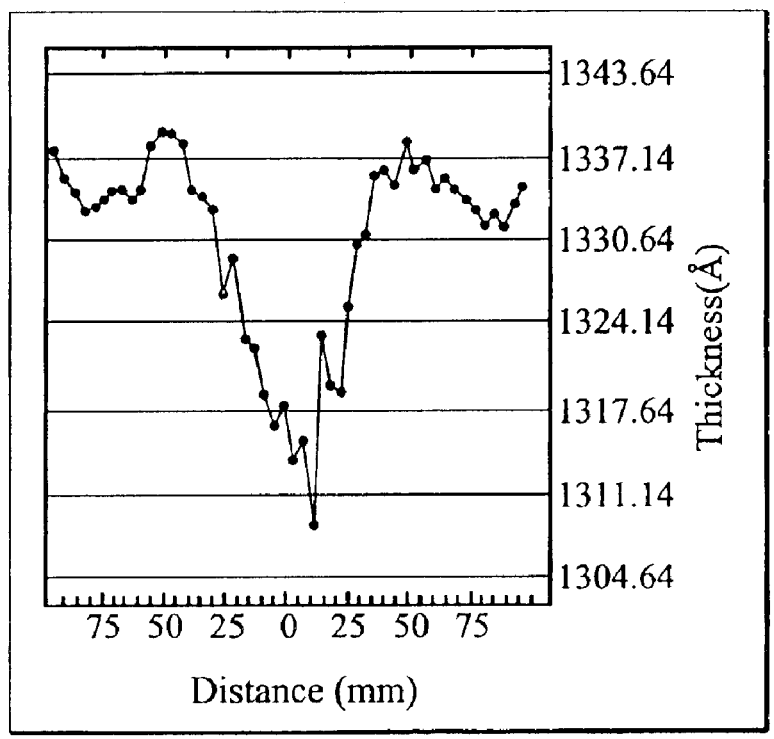
FIG. 2 is a graph showing the relation of the thickness of the photoresist layer with positions on the wafer in accordance with the traditional coating method.
Figure 3:
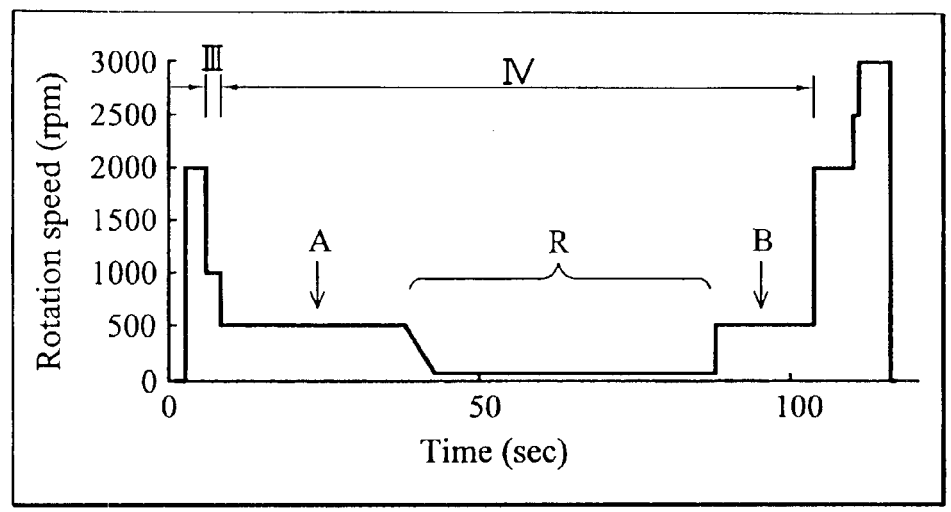
FIG. 3 shows the wafer rotation speeds in each step in accordance with the first embodiment of the present invention.

The coating method of the present invention coats a photoresist solution to form a photoresist film with a thickness of 1350 Å. A detailed coating recipe is given in Table 2. FIG. 3 shows the wafer rotation speeds in each step according to the first embodiment of the present invention.

TABLE 2

| step | time (sec) | Rotation speed (rpm) | Acceleration/ deceleration rate (rpm/sec) | |
|---|---|---|---|---|
| I | 1.0 | 0 | | |
| | 1.5 | 0 | | Spraying a solvent |
| II | 3.0 | 2000 | 10000 | |
| III | 2.6 | 1000 | 10000 | Dispensing a photoresist solution (2.5 cc/2.2 sec) |
| IV | 30.0 | 525 | 10000 | Spreading the photoresist solution |
| | 50.0 | 50 | 100 | Re-flowing the photoresist solution to the center |
| | 15.0 | 521 | 50000 | Re-spreading the photoresist solution |
| V | 6.0 | 2000 | 10000 | Cleaning edge and backside of the wafer |
| | 1.0 | 2500 | 10000 | Cleaning edge and backside of the wafer |
| | 5.0 | 3000 | 10000 | |
| | 1.0 | 0 | 10000 | |

Step I

Referring to Table 2 and FIG. 3, after the wafer is positioned in a spin coater and the rotation speed of the wafer is kept at 0 rpm/sec, a solvent is sprayed on the surface of the wafer for 1.5 seconds to prewet the surface of the wafer.

Step II

The solvent is dried for 3 seconds while the wafer is accelerated from 0 rpm to 2,000 rpm at a rate of 10,000 rpm/sec.

Step III

The photoresist solution is dispensed on the surface of the wafer at a rate of 2.5 cc/2.2 sec for 2.6 seconds while the wafer is decelerated from 2,000 rpm to 1,000 rpm at a rate of 10,000 rpm/sec.

Step IV

The coating solution dispensed on the wafer is spread for 30 seconds a first time while the wafer is decelerated from 1,000 rpm to 525 rpm at a rate of 10,000 rpm/sec, as shown in FIG. 3 marked A.

Step V

The wafer is accelerated from 1,000 rpm to 2,000 rpm at a rate of 10,000 rpm/sec and kept at 2,000 rpm while the edge and backside of the wafer are cleaned for 6 seconds. The wafer is accelerated from 2,000 rpm to 2,500 rpm at a rate of 10,000 rpm/sec and the edge and backside of the wafer are cleaned for 1 second.

The wafer is accelerated from 2,500 rpm to 3,000 rpm at a rate of 10,000 rpm/sec for 5 seconds.

Figure 4:
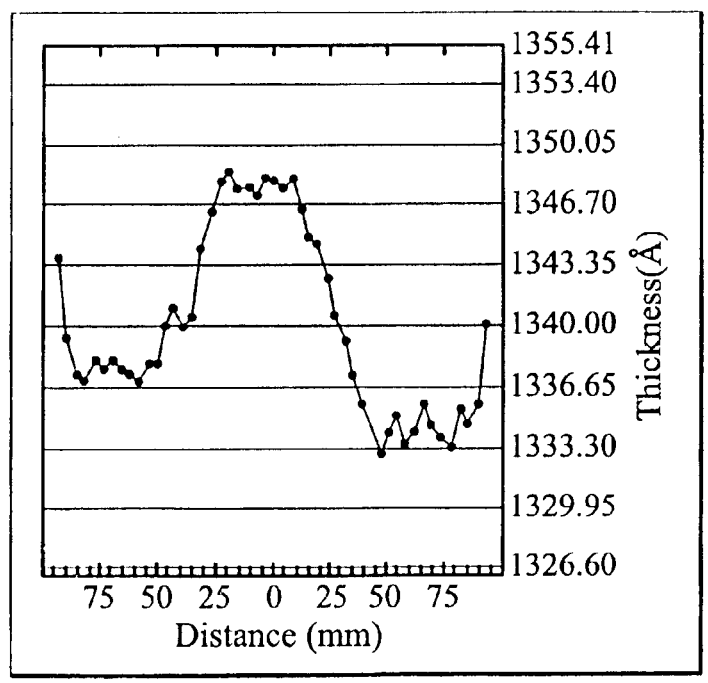
FIG. 4 is a graph showing the relation of the thickness of the photoresist layer with positions on the wafer in accordance with the first embodiment of the present invention.

The coating method of the first embodiment is used to uniformly coat the photoresist film on the 8 inch wafer. The obtained photoresist film has good uniformity, as shown in FIG. 4. The average thickness of the photoresist layer is 1334.06 Å and the thickness variation is reduced to 14.46 Å.

Second Embodiment

In general, reducing the dispensing rate of the coating solution reduces the loss of coating solution, thereby reducing production costs. However, the uniformity of the coating film is affected by reducing the dispensing rate of the coating solution. The lower the dispensing rate, the poorer the uniformity of the coating film.

However, in this embodiment the dispensing rate of the photoresist solution is reduced from 2.5 cc/2.2 sec used in step III in the first embodiment to 1.5 cc/1.7 sec.

Figure 5:
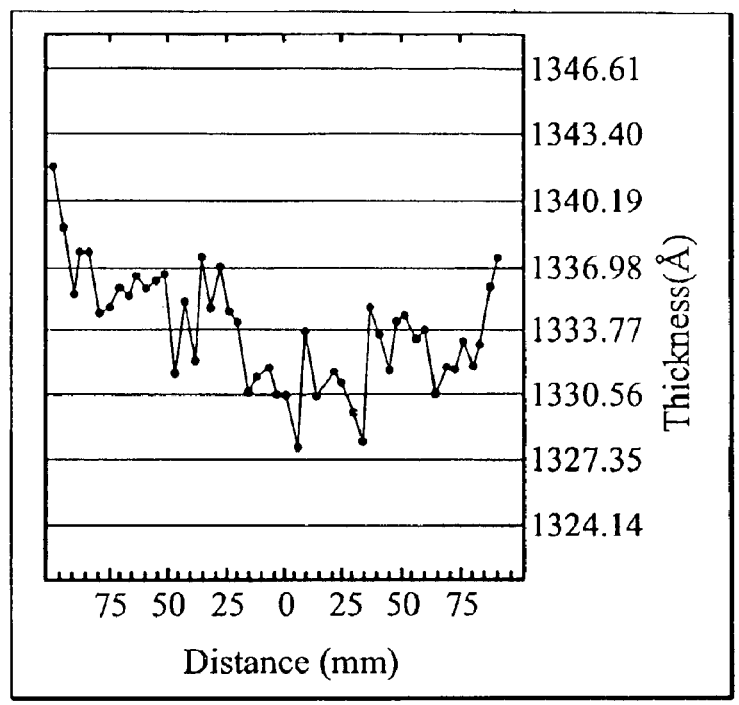
FIG. 5 is a graph showing the relation of the thickness of the photoresist layer with positions on the wafer in accordance with the second embodiment of the present invention.

Using the above-mentioned coating method on an 8 inch wafer, a photoresist film with good uniformity is obtained. As shown in FIG. 5, the average thickness of the photoresist film is 1340.00 Å, and the thickness variation is 15.63 Å. Although the thickness variation under the recipe in this second embodiment is slightly higher than that in the first embodiment, the coating film formed with the recipe in this second embodiment still exhibits good uniformity.

Therefore, for the coating method of the present invention, the amount of the coating solution can be reduced without affecting the uniformity of the coating film, thereby reducing production costs.

Third Embodiment

The time spent in step IV in the first embodiment is 95 seconds, and step IV takes more time than the other steps of the whole coating process. Step IV is thus a bottleneck step for the whole coating process.

Figure 6:
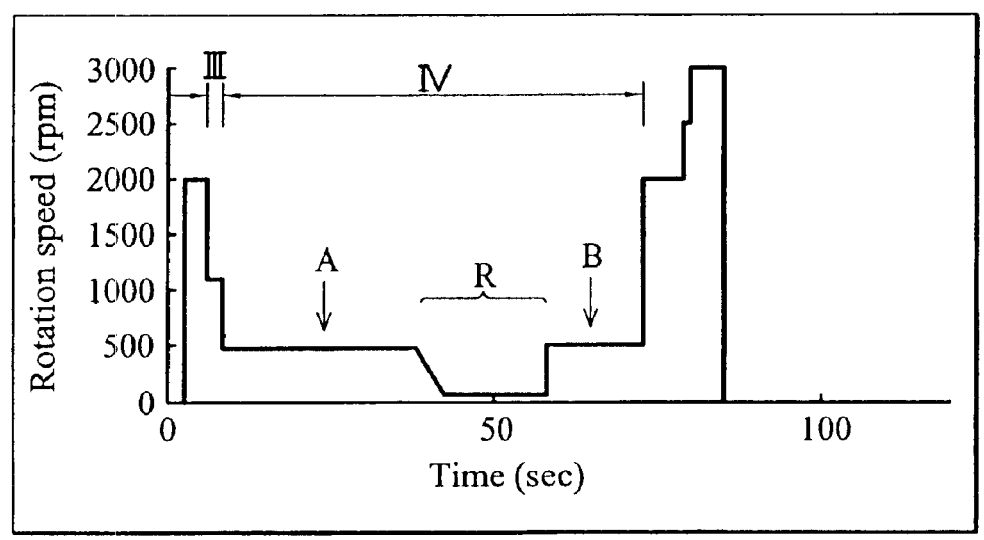
FIG. 6 shows the wafer rotation speeds in each step in accordance with the third embodiment of the present invention.
Figure 7:
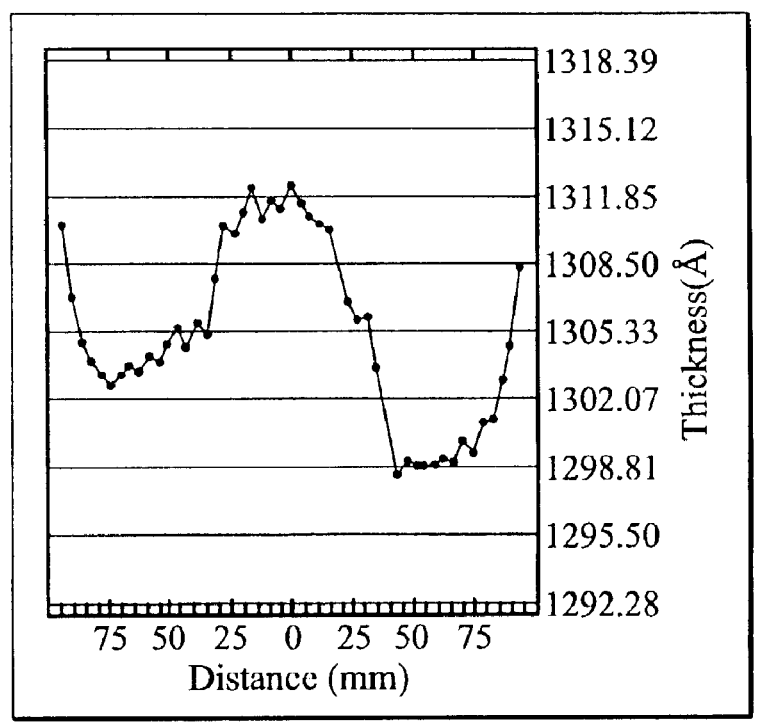
FIG. 7 is a graph showing the relation of the thickness of the photoresist layer with positions on the wafer in accordance with the third embodiment of the present invention.

In this embodiment, the time spent in step IV is reduced from 95 seconds in the first embodiment to 65 seconds. A detailed coating recipe is given in Table 3. FIG. 6 shows the wafer rotation speeds in each step.

TABLE 3

| step | time (sec) | Rotation speed (rpm) | Acceleration/ deceleration rate (rpm/sec) | |
|---|---|---|---|---|
| | 1.0 | 0 | | |
| I | 1.5 | 0 | | Spraying a solvent |
| II | 3.0 | 2000 | 10000 | |
| III | 2.6 | 1100 | 10000 | Dispensing a photoresist solution (1.5 cc/1.7 sec) |
| IV | 30.0 | 472 | 10000 | Spreading the photoresist solution |
| | 20.0 | 50 | 100 | Re-flowing the photoresist solution to the center |
| | 15.0 | 521 | 50000 | Re-spreading the photoresist solution |
| V | 6.0 | 2000 | 10000 | Cleaning edge and backside of the wafer |
| | 1.0 | 2500 | 10000 | Cleaning edge and backside of the wafer |
| | 5.0 | 3000 | 10000 | |
| | 1.0 | 0 | 10000 | |

Step I

Referring to Table 3 and FIG. 6, after the wafer is positioned in a spin coater and the rotation speed of the wafer is kept at 0 rpm/sec, a solvent is sprayed on the surface of the wafer for 1.5 seconds to prewet the surface of the wafer.

Step II

The solvent is dried for 3 seconds while the wafer is accelerated from 0 rpm to 2,000 rpm at a rate of 10,000 rpm/sec.

Step III

The photoresist solution is dispensed on the surface of the wafer at a rate of 1.5 cc/1.7 sec for 2.6 seconds while the wafer is decelerated from 2,000 rpm to 1,100 rpm at a rate of 10,000 rpm/sec.

Step IV

The coating solution dispensed on the wafer is spread for 30 seconds a first time while the wafer is decelerated from 1,100 rpm to 472 rpm at a rate of 10,000 rpm/sec as shown in FIG. 6 marked A.

Step V

The wafer is accelerated from 1,000 rpm to 2,000 rpm at a rate of 10,000 rpm/sec and kept at 2,000 rpm while the edge and backside of the wafer are cleaned for 6 seconds. The wafer is accelerated from 2,000 rpm to 2,500 rpm at a rate of 10,000 rpm/sec and the edge and backside of the wafer are cleaned for 1 second.

The wafer is accelerated from 2,500 rpm to 3,000 rpm at a rate of 10,000 rpm/sec for 5 seconds.

The coating method of the third embodiment is used to coat the photoresist film with a uniformity thickness on the 8 inch wafer. The obtained photoresist film has good uniformity, as shown in FIG. 4. The average thickness of the photoresist layer is 1305.33 Å and the thickness variation is reduced to 13.72 Å.

Therefore, the time spent in step IV can be reduced using the coating method of the present invention. The time spent in step IV can save 30 seconds or more without affecting the uniformity of the coating film, thereby improving the production yield.

As mentioned above, a photoresist film or an ARC film with good uniformity can be obtained using the coating method of the present invention. Furthermore, the dispensing rate of the coating solution can be reduced to decrease the amount of the coating solution, thereby reducing production costs. Moreover, the total time spent to spread the coating solution (that is the bottleneck step, step IV) can be reduced to improve the production yield.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for coating low viscosity materials, comprising:

dispensing a coating solution onto a wafer while the wafer is rotated at a first rotation speed;

decelerating the wafer to a second rotation speed at a first deceleration rate of 10,000 rpm/sec to spread the coating solution;

decelerating the wafer to a third rotation speed at a second deceleration rate of 100 rpm/sec so the coating solution reflows to the center of the wafer; and accelerating the wafer to a fourth rotation speed at a third acceleration rate of 50,000 rpm/sec, thereby spreading the coating solution again.

2. The method as claimed in claim 1, wherein the coating solution is a photoresist solution.

3. The method as claimed in claim 1, wherein the coating solution is an ARC solution.

4. The method as claimed in claim 1, further comprising, before dispensing the coating solution onto the wafer, prewetting a surface of the wafer with a solvent and drying.

5. The method as claimed in claim 1, further comprising, after spreading the coating solution again, cleaning the wafer.

6. The method as claimed in claim 1, wherein the coating solution is dispensed at a dispensing rate between 2.5 cc/2.2 sec and 1.5 cc/1.7 sec.

7. The method as claimed in claim 1, wherein the first rotation speed is 1000 rpm or 1100 rpm.

8. The method as claimed in claim 1, wherein the second rotation speed is 472 rpm or 525 rpm.

9. The method as claimed in claim 1, wherein the third rotation speed is 50 rpm.

10. The method as claimed in claim 1, wherein the fourth rotation speed is 521 rpm.

11. The method as claimed in claim 1. wherein the wafer is maintained at the second rotation speed for 30 sec.

12. The method as claimed in claim 1, wherein the wafer is maintained at the third rotation speed for a period of time of 20 sec or 50 sec.

13. The method as claimed in claim 1, wherein the wafer is maintained at the fourth rotation speed for 15 sec.

* * * * *